(12) United States Patent
Jang

(10) Patent No.: US 9,349,465 B2
(45) Date of Patent: May 24, 2016

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Yoon Soo Jang, Chungcheongbuk-do (KR)

(73) Assignee: SK HYNIX INC., Icheon-Si, Gyeonggi-Do (KR)

( * ) Notice: Subject to any disclaimer, the term of this patent is extended or adjusted under 35 U.S.C. 154(b) by 79 days.

(21) Appl. No.: 14/154,839

(22) Filed: Jan. 14, 2014

(65) Prior Publication Data

US 2015/0009758 A1    Jan. 8, 2015

(30) Foreign Application Priority Data

Jul. 2, 2013  (KR) .................. 10-2013-0077412

(51) Int. Cl.
| | | |
|---|---|---|
| *G11C 11/34* | (2006.01) | |
| *G11C 16/24* | (2006.01) | |
| *G11C 16/34* | (2006.01) | |
| *H01L 27/115* | (2006.01) | |
| *G11C 16/04* | (2006.01) | |

(52) U.S. Cl.
CPC ............ *G11C 16/24* (2013.01); *G11C 16/0483* (2013.01); *G11C 16/3427* (2013.01); *H01L 27/11582* (2013.01); *G11C 16/0408* (2013.01); *H01L 27/1157* (2013.01)

(58) Field of Classification Search
USPC ............... 365/185.17, 185.18, 185.2, 185.27, 365/185.33
See application file for complete search history.

(56) References Cited

U.S. PATENT DOCUMENTS

| | | | | |
|---|---|---|---|---|
| 7,239,556 | B2 * | 7/2007 | Abe et al. ................. | 365/185.17 |
| 7,301,815 | B2 * | 11/2007 | Kurata et al. .............. | 365/185.2 |
| 7,894,268 | B2 * | 2/2011 | Hosono ............. | G11C 16/0483 |
| | | | | 365/185.17 |
| 8,089,811 | B2 * | 1/2012 | Kang et al. ............... | 365/185.17 |
| 8,238,153 | B2 * | 8/2012 | Lee .................... | G11C 16/0483 |
| | | | | 365/185.17 |
| 8,570,805 | B2 * | 10/2013 | Lee et al. ................. | 365/185.17 |
| 8,576,629 | B2 * | 11/2013 | Choe et al. ............... | 365/185.18 |
| 8,873,294 | B2 * | 10/2014 | Shim et al. ............... | 365/185.18 |
| 8,891,315 | B2 * | 11/2014 | Lee et al. ................. | 365/185.17 |
| 8,917,552 | B2 * | 12/2014 | Maeda ...................... | 365/185.17 |
| 8,923,059 | B2 * | 12/2014 | Joo .......................... | 365/185.17 |
| 8,929,145 | B2 * | 1/2015 | Lee et al. ................. | 365/185.17 |
| 8,976,602 | B2 * | 3/2015 | Shiga et al. .............. | 365/185.17 |
| 8,976,603 | B2 * | 3/2015 | Iwai ......................... | 365/185.17 |

FOREIGN PATENT DOCUMENTS

KR    1020090070739 A    7/2009

* cited by examiner

*Primary Examiner* — Trong Phan
(74) *Attorney, Agent, or Firm* — Hauptman Ham, LLP

(57) ABSTRACT

A semiconductor memory device and a method of operating the same are provided. The semiconductor memory device includes memory cells stacked on a substrate. The method includes applying a reference voltage to an unselected drain select line, applying a drain selection voltage to a selected drain select line, and applying a word line voltage to a normal word line. Before the word line voltage is applied to the normal word line, a positive voltage is applied to a dummy word line to bounce the unselected drain select line.

16 Claims, 10 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. §119(a) to Korean patent application number 10-2013-0077412 filed on Jul. 2, 2013, in the Korean Intellectual Property Office, the entire disclosure of which is incorporated herein by reference in its entirety.

FIELD

This disclosure relates to a semiconductor memory device and a method of operating the same.

BACKGROUND

A semiconductor memory device is a memory device embodied by using a semiconductor, such as silicon (Si), germanium (Ge), gallium arsenide (GaAs), or indium phosphide (InP). Semiconductor memory devices are broadly categorized into volatile memory devices and nonvolatile memory devices.

A volatile memory device is a memory device that loses stored data when power supply is cut off. Volatile memory devices include a static random access memory (SRAM), a dynamic RAM (DRAM), and a synchronous DRAM (SDRAM). A nonvolatile memory device is a memory device that retains stored data even if power supply is cut off. Nonvolatile memory devices include a read-only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM). Flash memory devices are broadly divided into a NOR type and a NAND type.

In recent years, research has been conducted on a semiconductor memory device having a 3-dimensional array structure to improve the integration density of semiconductor memory devices. In the semiconductor memory device having the 3-dimensional array structure, it is possible that Y-disturbance occurs in an unselected string, unlike a semiconductor memory device having a 2-dimensional array structure.

SUMMARY

Some embodiments provide a method of operating a semiconductor memory device comprising memory cells stacked on a substrate. The method includes applying a reference voltage to an unselected drain select line, applying a drain selection voltage to a selected drain select line, and applying a word line voltage to a normal word line. Before the word line voltage is applied to the normal word line, a positive voltage is applied to a dummy word line.

A semiconductor device according to some embodiments includes a memory cell array comprising memory cells stacked on a substrate and connected with each other into cell strings, and a peripheral circuit. The peripheral circuit is configured to apply a reference voltage to an unselected drain select line of an unselected cell string of the cell strings, apply a word line voltage to a normal word line of the cell strings, and apply a positive voltage to a dummy word line of the cell strings before the word line voltage is applied to the normal word line.

A memory system in accordance with some embodiments includes a semiconductor memory device, and a controller configured to control the semiconductor memory device. The semiconductor memory device includes a memory cell array including memory cells stacked on a substrate and connected with each other into cell strings, and a peripheral circuit. The peripheral circuit is configured to apply a reference voltage to an unselected drain select line of an unselected cell string of the cell strings, apply a word line voltage to a normal word line of the cell strings, and apply a positive voltage to a dummy word line of the cell strings before the word line voltage is applied to the normal word line.

BRIEF DESCRIPTION OF THE DRAWINGS

The above and other features and advantages in some embodiments will become more apparent to those of ordinary skill in the art by describing in detail some embodiments thereof with reference to the attached drawings in which.

DETAILED DESCRIPTION

In some embodiments, it is assumed that a normal word line is a word line corresponding to a dummy word line and is synonymous with a main word line.

Some embodiments will now be described more fully hereinafter with reference to the accompanying drawings, in which some embodiments are shown. This disclosure, however, encompasses other different forms and should not be construed as limited to the embodiments set forth herein. Rather, these embodiments are provided so that this disclosure is thorough and complete and fully conveys the scope of the present disclosure to one ordinarily skilled in the art.

Herein, it will be understood that when an element is referred to as being "connected" or "coupled" to another element, it can be directly connected or coupled to the other element or indirectly connected or coupled to the other element by intervening another element therebetween. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Figure 1:
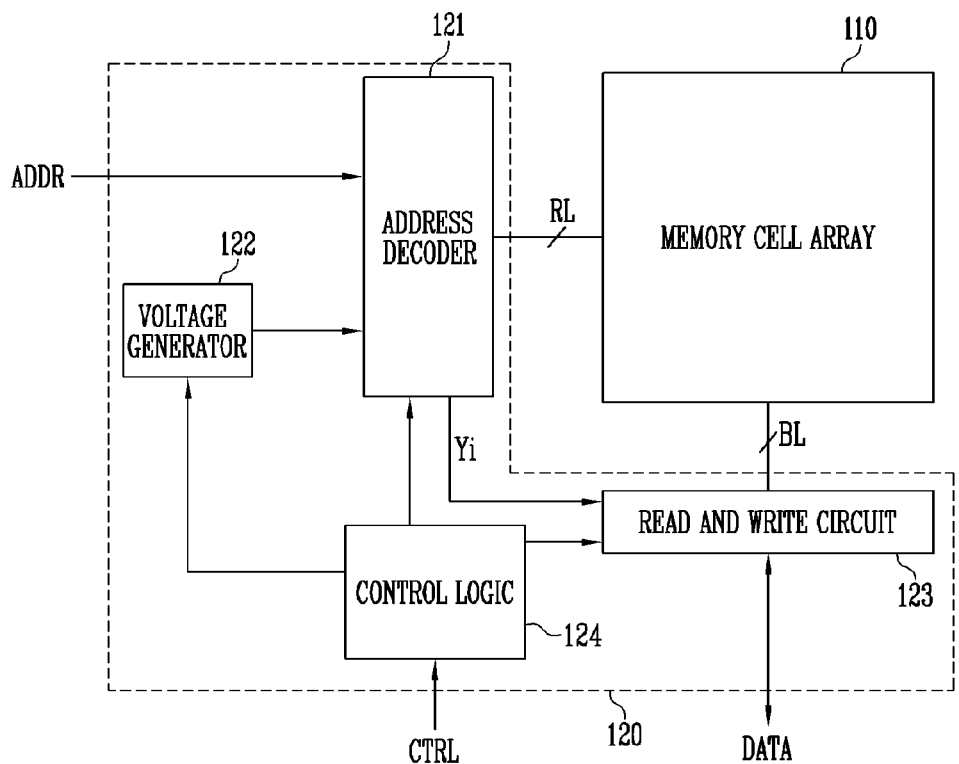
FIG. 1 is a block diagram of a semiconductor memory device according to some embodiments.

FIG. 1 is a block diagram of a semiconductor memory device 100 according to some embodiments Referring to FIG. 1, the semiconductor memory device 100 includes a memory cell array 110 and a peripheral circuit 120 configured to drive the memory cell array 110.

The memory cell array 110 is connected to an address decoder 121 through row lines RL. The memory cell array 110 is connected to a read and write circuit 123 through bit lines BL. The memory cell array 110 includes memory blocks. Each of the memory blocks includes cell strings. Each of the cell strings includes memory cells stacked on a substrate. In some embodiments, the memory cells are nonvolatile memory cells. In some embodiments, each of the memory cells is a single-level cell or a multi-level cell. Hereinafter, it is assumed for brevity that each of the memory cells is a single-level cell. The memory cell array 110 will be described in further detail with reference to FIGS. 2 through 7.

The peripheral circuit 120 is configured to drive the memory cell array 110. The peripheral circuit 120 includes an address decoder 121, a voltage generator 122, a read and write circuit 123, and a control logic 124.

The address decoder 121 is connected to the memory cell array 110 through the row lines RL. The row lines RL include drain select lines, word lines, a source selection line, and a common source line. The address decoder 121 is configured to drive the row lines RL in response to the control of the control logic 124. The address decoder 121 receives addresses ADDR from the outside or an input/output (I/O) buffer (not shown) of the semiconductor memory device 100.

The address decoder 121 is configured to decode a block address out of the received addresses ADDR. The address decoder 121 selects at least one memory block in response to the decoded block address.

The address decoder 121 is configured to decode a row address out of the received addresses ADDR. In response to the decoded row address, the address decoder 121 selects one of drain select lines connected to the selected memory block and one of word lines connected to the selected memory block.

The address decoder 121 is configured to decode a column address out of the received addresses ADDR. The address decoder 121 transmits a decoded column address Yi to the read and write circuit 123.

Read and program operations of the semiconductor memory device 100 are performed in units of pages which are small groups of memory words that are accessed, internal to the memory, in parallel rather than one at a time. Upon a read operation request or a program operation request, the addresses ADDR include a block address, a row address, and a column address. The address decoder 121 selects one memory block, one drain select line, and one word line in response to the address ADDR, and provide the decoded column address Yi to the read and write circuit 123.

Erase operations of the semiconductor memory device 100 are performed in units of memory blocks. Upon an erase operation request, the addresses ADDR include a block address. The address decoder 121 selects one memory block in response to the address ADDR.

The address decoder 121 includes a block decoder, a row decoder, a column decoder, and an address buffer.

The voltage generator 122 is configured to generate voltages using an external voltage supplied to the semiconductor memory device 100. The voltage generator 122 operates in response to the control of the control logic 124. Voltages generated by the voltage generator 122 are used as voltages applied to the memory cell array 110. In some embodiments, the voltage generator 122 includes a circuit configured to regulate an external voltage and generate a power supply voltage. In some embodiments, the voltage generator 122 includes pumping capacitors and is configured to selectively enable the pumping capacitors and generate voltages. The generated voltages are transmitted to the address decoder 121.

The read and write circuit 123 is connected to the memory cell array 110 through the bit lines BL. The read and write circuit 123 operates in response to the control of the control logic 124.

During program and read operations, the read and write circuit 123 exchanges data with the outside or with an I/O buffer (not shown) of the semiconductor memory device 100. During the program operation, the read and write circuit 123 receives data DATA to be programmed. Also, the read and write circuit 123 transmits the received data DATA to bit lines indicated by the decoded column address Yi, out of the bit lines BL. The transmitted data DATA is programmed in selected memory cells. During a read operation, the read and write circuit 123 reads data from selected memory cells through bit lines indicated by the decoded column address Yi, out of the bit lines BL, and output the read data DATA. During an erase operation, the read and write circuit 123 floats bit lines BL.

In some embodiments, the read and write circuit 130 includes page buffers (or page registers) and a column selection circuit.

The control logic 124 is connected to the address decoder 121, the voltage generator 122, and the read and write circuit 123. The control logic 124 receives a control signal CTRL from the outside or the I/O buffer (not shown) of the semiconductor memory device 100. The control logic 124 is configured to control general operations of the semiconductor memory device 100 in response to the control circuit CTRL.

The semiconductor memory device 100 further includes the I/O buffer (not shown). The I/O buffer externally receives a control signal CTRL and an address ADDR and transmits the received control signal CTRL and address ADDR to the control logic 124 and the address decoder 121, respectively. Also, the I/O buffer is configured to transmit externally received data DATA to the read and write circuit 123 and externally transmits data DATA received from the read and write circuit 123.

The peripheral circuit 120 according to some embodiments is configured to apply a reference voltage to an unselected drain select line, apply a word line voltage to a normal word line, and apply a positive voltage to a dummy word line before the word line voltage is applied to the normal word line. When the positive voltage is applied to the dummy word line, the unselected drain select line is bounced, i.e., a voltage on the unselected drain select line temporarily rises and then drops. Also, the peripheral circuit 120 applies a positive voltage to the dummy word line during the application of a reference voltage to the unselected drain select line. Furthermore, before the reference voltage is applied to the unselected drain select line, the peripheral circuit 120, in at least one embodiment, applies the positive voltage to the dummy word line during the application of a precharge voltage. In this case, the application of the precharge voltage is ended before the word line voltage is applied to the normal word line.

The peripheral circuit 120 applies a positive voltage to the dummy word line during the application of a drain selection voltage, e.g., a power supply voltage, to a selected drain select line. Furthermore, before the power supply voltage is applied to the selected drain select line, the peripheral circuit 120, in at least one embodiment, applies a positive voltage to the dummy word line during the application of the precharge voltage. In this case, the application of the precharge voltage is ended before the word line voltage is applied to the normal word line.

In the above-described operations, a positive voltage applied to the dummy word line is maintained, in at least one embodiment, until the application of the word line voltage is ended.

In some embodiments, the semiconductor memory device 100 is a flash memory device.

Figure 2:
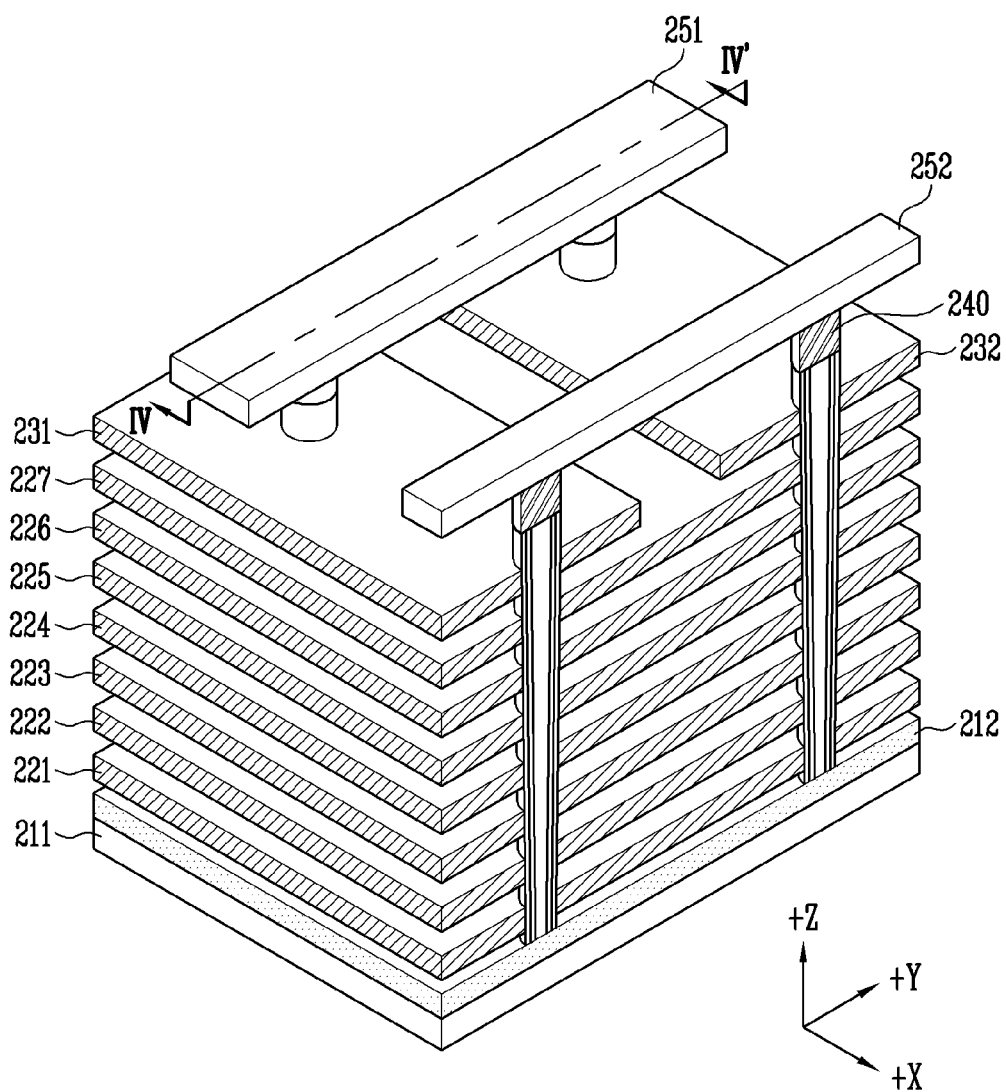
FIG. 2 is a perspective view of a memory cell array according to some embodiments.
Figure 3:
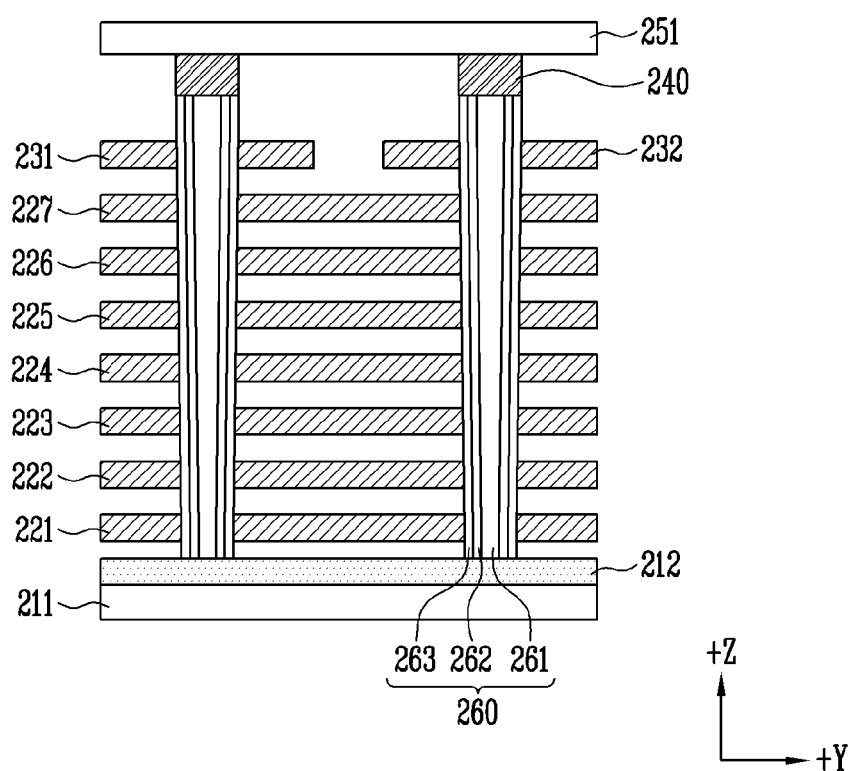
FIG. 3 is a cross-sectional view taken along line IV-IV' of FIG. 2.

FIG. 2 is a perspective view of a memory cell array according to some embodiments, and FIG. 3 is a cross-sectional view taken along a line IV-IV' of FIG. 2.

Referring to FIGS. 2 and 3, a second-type (e.g., n-type) doping region 212 is provided on a substrate 211 of a first type (e.g., p type). The substrate 211 is provided as a pocket p-well disposed in an n-well.

First through seventh conductive materials 221 to 227 are disposed a predetermined distance apart from the second-type doping region 212 in a Z direction. Each of the first through seventh conductive materials 221 to 227 extends in an X direction and a Y direction. Also, eighth conductive materials 231 and 232 are spaced apart from the seventh conductive material 227 in the Z direction. The eighth conductive materials 231 and 232 are spaced apart from each other in the Y direction. In some embodiments, insulating materials (not shown) are provided between the first through seventh conductive materials 221 to 227 and the eighth conductive materials 231 and 232.

Hereinafter, it is assumed that the first through seventh conductive materials 221 to 227 have first through seventh heights, respectively, and the eighth conductive materials 231 and 232 have an eighth height.

The pillars are formed through the first through seventh conductive materials 221 to 227 and the eighth conductive materials 231 and 232 and spaced apart from one another in the X direction and the Y direction. Each of the pillars 260 extends in the Z direction. In some embodiments, widths of each of the pillars 260 measured in the X direction and the Y direction are reduced toward the substrate 211.

Each of the pillars 260 includes an internal material 261, a middle layer 262, and a surface layer 263. The internal material 261 includes an insulating material. The middle layer 262 includes a silicon material doped with a first-type dopant. The middle layer 262 operates as a Z-directional channel (refer to C in FIGS. 11 and 12). The surface layer 263 is configured to store data.

A drain 240 is provided on each of the pillars 260. Each of drains 240 includes, for example, a silicon material doped with a second-type dopant. Upper conductive materials 251 and 252 are provided on the drains 240 and extend in the Y direction. The upper conductive materials 251 and 252 are spaced apart from each other in the X direction.

Each of the pillar 260 and a conductive material disposed adjacent thereto operates as a single cell transistor.

Since each of the pillars 260 abuts any one of the conductive materials 221 to 227 having the first through seventh heights and the conductive materials 231 and 232 having the eighth height, 8 cell transistors correspond to each of the pillars 260. One pillar 260 corresponds to one cell string. Each of the cell strings includes cell transistors having first through eighth heights.

Figure 4:
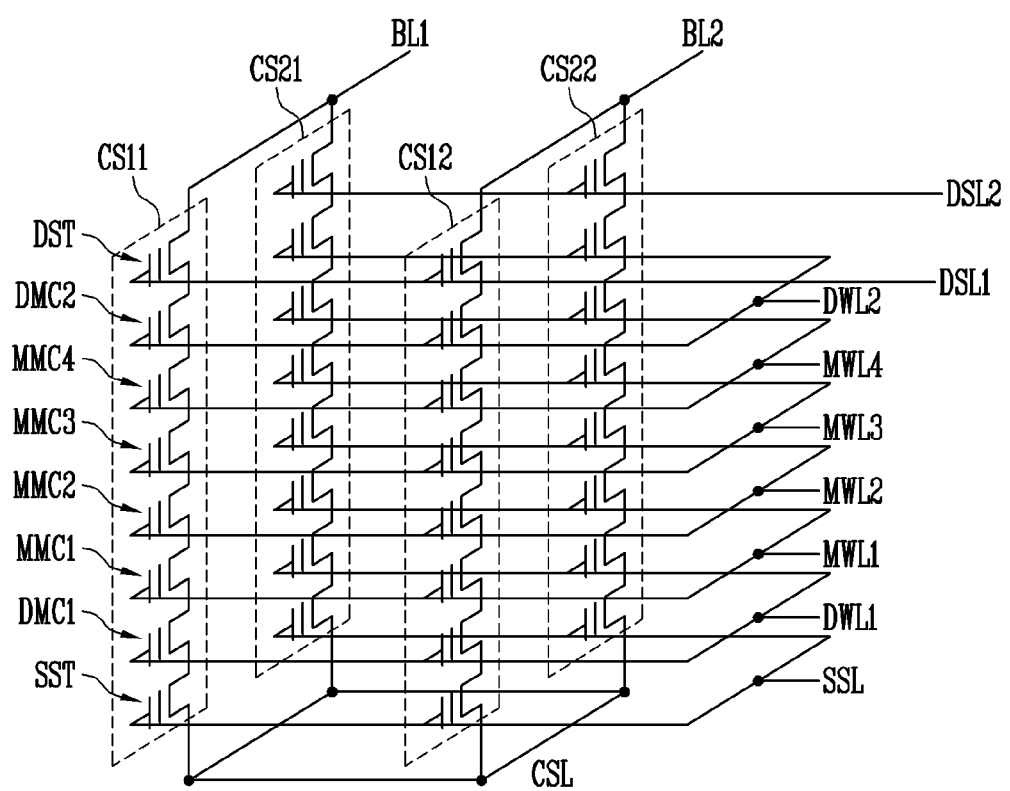
FIG. 4 is an equivalent circuit diagram of the memory cell array described with reference to FIGS. 2 and 3.

The memory cell array shown in FIGS. 2 and 3 is a memory cell array according to some embodiments and is changed in various ways as apparent to those of ordinary skill in the art. For example, although FIGS. 2 and 3 illustrate a case in which eight-layer conductive materials 221 to 227, 231, and 232 are provided, conductive materials having more or fewer than eight layers are provided. For brevity, FIGS. 2 and 3 illustrate an example in which two pillars are connected to one bit line (e.g., 252). However, it will be understood that more than two pillars are connected to one bit line in at least one embodiment. For brevity, FIGS. 3 and 4 illustrate an example in which two bit lines 251 and 252 are provided. However, it will be understood that more than two bit lines are provided in at least one embodiment. That is, m pillars are connected to one bit line, and n bit lines are provided. Here, each of m and n is a natural number.

FIG. 4 is an equivalent circuit diagram of the memory cell array described with reference to FIGS. 2 and 3.

As described above, it is assumed in some embodiments that normal word line is synonymous with main word line.

Referring to FIGS. 2 through 4, the second-type doping region 212 operates as a common source line CSL. The first conductive material 221 having the first height operates as a source selection line SSL. The second conductive material 222 having the second height operates as a first dummy word line DWL1. The third through sixth conductive materials 223 to 226 having the third through sixth heights operate as first through fourth main word lines MWL1 to MWL4, respectively. The seventh conductive material 227 having the seventh height operates as a second dummy word line DWL2. The eighth conductive materials 231 and 232 having the eighth height operate as first and second drain select lines DSL1 and DSL2, respectively. The first and second upper conductive materials 251 and 252 operate as first and second bit lines BL1 and BL2, respectively.

As described above with reference to FIGS. 2 and 3, each of the pillars 260 corresponds to one cell string CS.

Hereinafter, cell strings CS11, CS12, CS21, and CS22 will be defined in units of rows and columns.

Cell strings connected in common to one bit line are defined as one column. Cell strings CS11 and CS12 connected to the first bit line BL1 are correspond to a first column. Cell strings CS12 and CS22 connected to the second bit line BL2 correspond to a second column.

As described above with reference to FIGS. 2 and 3, each of the cell strings CS includes cell transistors having first through eighth heights. In each of the cell strings CS, the cell transistor having the first height operates as a source selection transistor SST. In each of the cell strings CS, the cell transistor having the second height operates as a first dummy memory cell DMC1. In each of the cell strings CS, the cell transistors having the third through sixth heights operate as first through fourth main memory cells MMC1 to MMC4, respectively. In each of the cell strings CS, the cell transistor having the seventh height operates as a second dummy memory cell DMC2. In each of the cell strings CS, the cell transistor having the eighth height operates as a drain selection transistor DST. The selection transistors SST and DST, the dummy memory cells DMC1 and DMC2, and the main memory cells MMC1 to MMC4 have the same structure.

Memory cells having one of the heights and corresponding to one row constitute a single page. For example, memory cells included in the cell strings CS11 and CS12, out of the memory cells having the third height, constitute one page, while memory cells included in the cell strings CS21 and CS22, out of the memory cells having the third height, constitute another page.

The source selection transistors SST of the respective cell strings CS are connected in common to the source selection line SSL.

Memory cells having the same height are connected in common to one word line. In this case, the memory cells refer to dummy memory cells DMC or main memory cells MMC, and the word line refers to a dummy word line DWL or a main word line MWL. The first dummy memory cell DMC1 of each of the cell strings CS are connected to the first dummy word line DWL1. The first through fourth main word lines MWL1 to MWL4 of each of the cell strings CS are connected to first through fourth main word lines MWL1 to MWL4, respectively. The second dummy memory cell DMC2 of each of the cell strings CS is connected to the second dummy word line DWL2.

Cell strings disposed in different rows are connected to different drain select lines DSL. Drain selection transistors DST of the respective cell strings CS11 and CS12 disposed in a first row are connected to a first drain select line DSL. Drain selection transistors DST of the respective cell strings CS21 and CS22 disposed in a second row are connected to a second drain select line DSL2.

By selecting and unselecting the drain select lines DSL1 and DSL2, each of cell strings (e.g., CS21 and CS22) connected to an unselected drain select line (e.g., DSL2) is electrically isolated from the corresponding bit line, and each of cell strings (e.g., CS11 and CS12) connected to a selected drain select line DSL1 is electrically connected to the corresponding bit line.

Program and read operations are performed in units of pages. During the program and read operations, one of the drain select lines DSL1 and DSL2 is selected, and one main word line is selected. As a result, memory cells connected to a selected main word line, out of cell strings (e.g., CS11 and CS12) connected to a selected drain select line (e.g., DSL1), are accessed at the same time.

The equivalent circuit shown in FIG. 4 is an equivalent circuit according to some embodiments, and is changed in various ways according to a structure of a memory cell array as apparent to those of ordinary skill in the art.

Figure 5:
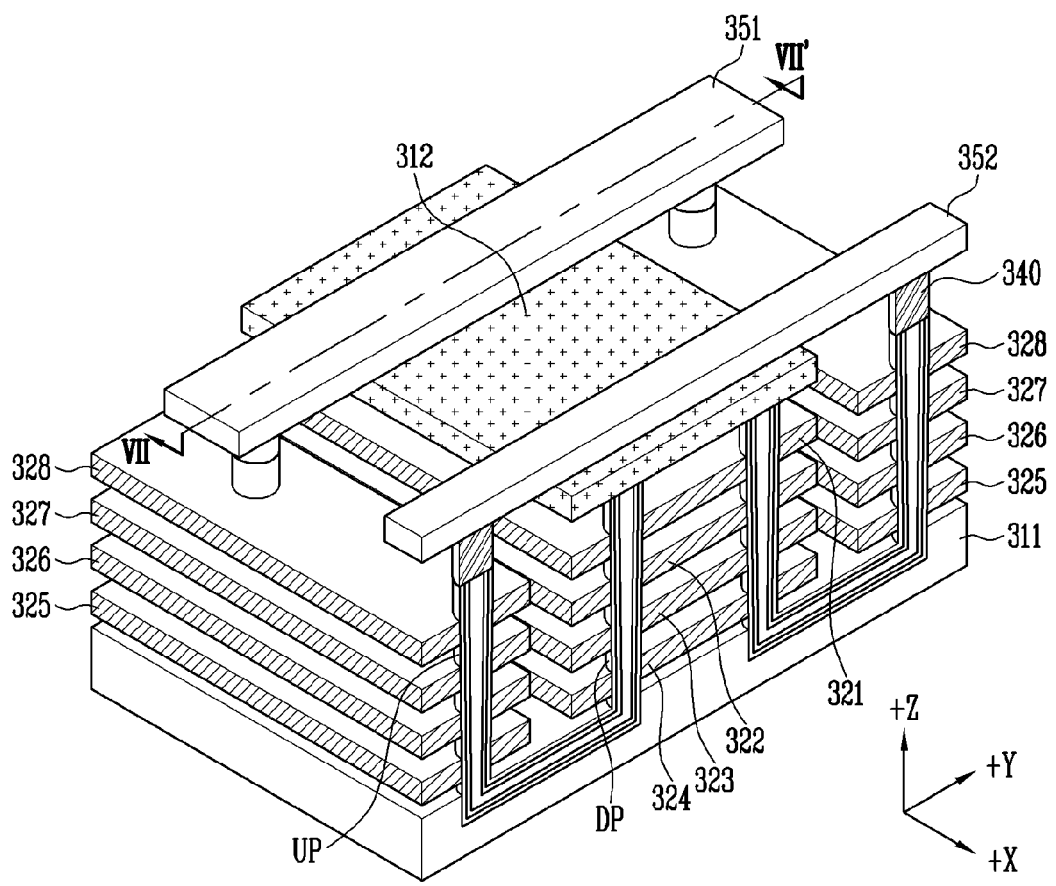
FIG. 5 is a perspective view of a memory cell array according to some embodiments.
Figure 6:
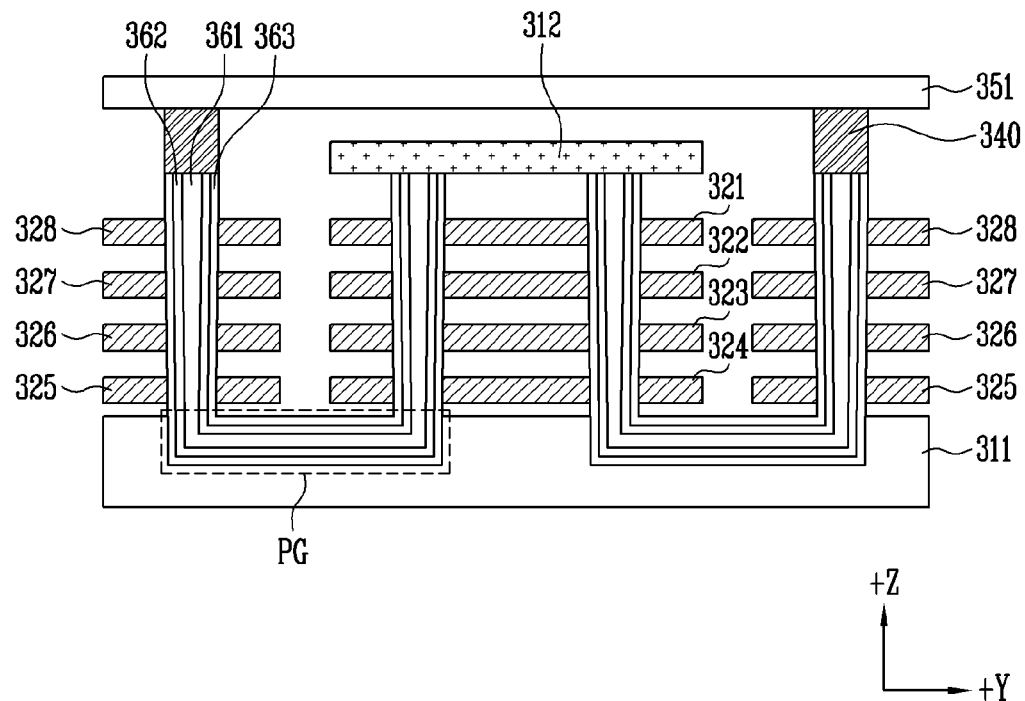
FIG. 6 is a cross-sectional view taken along line VII-VII' of FIG. 5.

FIG. 5 is a perspective view of a memory cell array (BLK1b) according to some embodiments, and FIG. 6 is a cross-sectional view taken along a line VII-VII' of FIG. 5.

Figure 7:
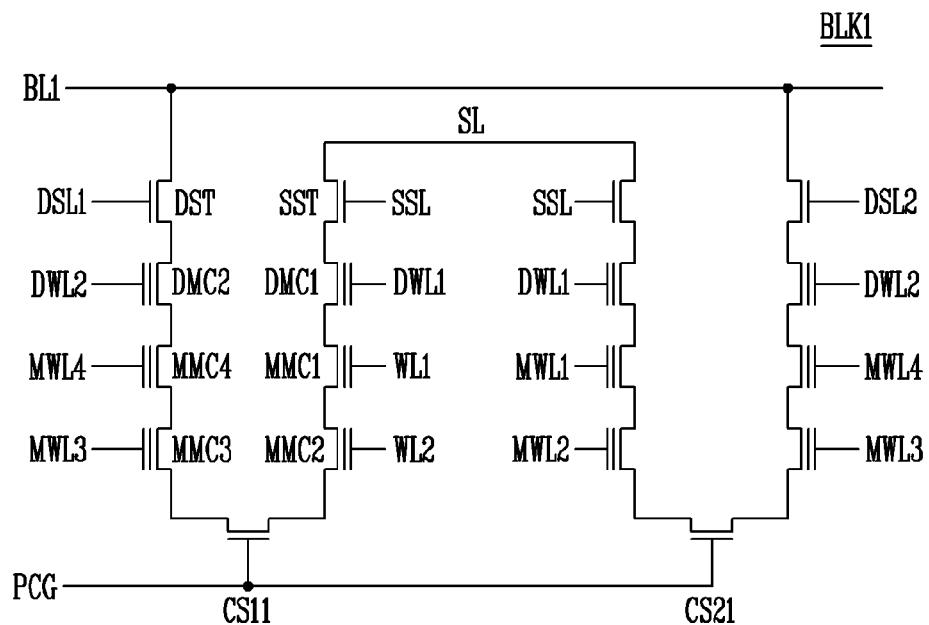
FIG. 7 is an equivalent circuit diagram of a memory block described with reference to FIGS. 5 and 6.

In addition, FIG. 7 is an equivalent circuit diagram of the memory block described with reference to FIGS. 5 and 6, which corresponds to one bit line (e.g., BL1 or BL2) of the equivalent circuit shown in FIG. 4.

Referring to FIGS. 5 through 7, first through fourth conductive materials 321 to 324 are provided on a substrate 311 and extend in an X direction and a Y direction. The first through fourth conductive materials 321 to 324 are spaced a predetermined distance apart from one another in a Z direction.

Fifth through eighth conductive materials 325 to 328 are provided on the substrate 311 and extend in the X direction and the Y direction. The fifth through eighth conductive materials 325 to 328 are spaced a predetermined distance apart from one another in the Z direction. The fifth through eighth conductive materials 325 to 328 spaced a predetermined distance apart from one another in the Y direction.

lower pillars DP are formed through the first through fourth conductive materials 321 to 324. Each of the lower pillars DP extends in the Z direction. Also, upper pillars are formed through the fifth through eighth conductive materials 325 to 328. Each of the upper pillars UP extends in the Z direction.

Each of the lower pillars DP and the upper pillars UP includes an internal material 361, a middle layer 362, and a surface layer 363. As described with reference to FIGS. 3 and 4, the middle layer 362 operates as a channel of a cell transistor. The surface layer 363 includes a blocking insulating layer, a charge storage layer, and a tunneling insulating layer.

The lower pillar DP and the upper pillar UP are connected by a pipe gate PG (PCG). The pipe gate PG is disposed in the substrate 311.

A second-type doping material 312 is provided on the lower pillar DP and extend in the X direction and the Y direction. The second-type doping material 312 operates as a common source line (refer to CSL in FIGS. 4 and 7).

A drain 340 is provided on the upper pillar UP. Also, first and second upper conductive materials 351 and 352 are provided on drains and extend in the Y direction. The first and second upper conductive materials 351 and 352 are disposed apart from one another in the X direction. The first and second upper conductive materials 351 and 352 operate as first and second bit lines (refer to BL1 and BL2 in FIGS. 5 and 8), respectively.

Figure 8:
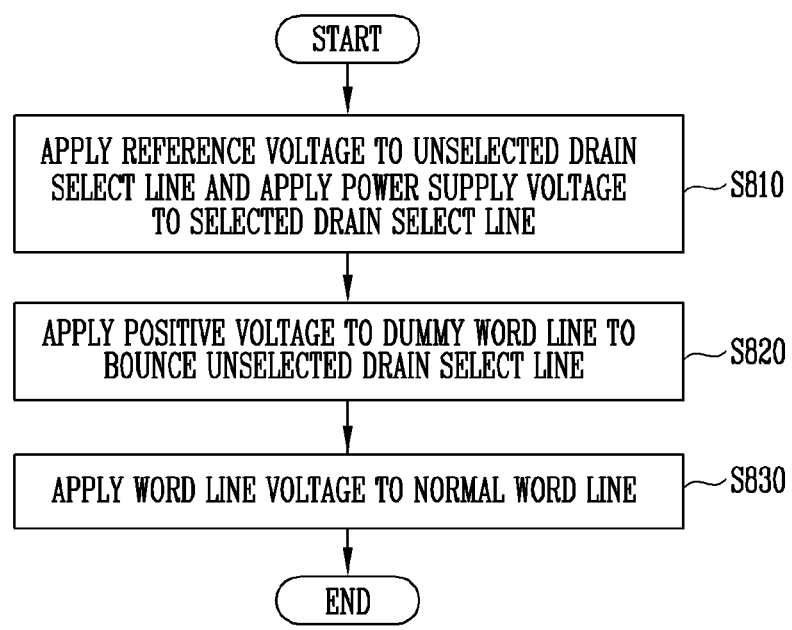
FIG. 8 is a flowchart of operations of a semiconductor memory device according to some embodiments.

The first conductive material 321 operates as a source selection line (refer to SSL in FIGS. 5 and 8), and the second conductive material 322 operates as a first dummy word line (refer to DWL1 in FIGS. 5 and 8). The third and fourth conductive materials 323 and 324 operate as first and second main word lines (refer to MWL1 and MWL2 in FIGS. 5 and 8), respectively. The fifth and sixth conductive materials 325 and 326 operate as third and fourth main word lines (refer to MWL3 and MWL4 in FIGS. 5 and 8), respectively. The seventh conductive material 327 operates as a second dummy word line (refer to DWL2 in FIGS. 5 and 8), and the eighth conductive material 328 operates as a drain select line (refer to DSL in FIGS. 5 and 8).

The lower pillar DP and the first through fourth conductive materials 321 to 324 disposed adjacent to the lower pillar DP constitute a lower string. The upper pillar UP and the fifth through eighth conductive materials 325 to 328 disposed adjacent to the upper pillar UP constitute an upper string. The lower string and the upper string are connected by the pipe gate PG. One end of the lower string is connected to the second-type doping material 312 that operates as the common source line CSL. One end of the upper string is connected to the corresponding bit line through a drain 320. One lower string and one upper string constitute one cell string connected between the second-type doping material 312 and the corresponding bit line. As a result, an equivalent circuit of the memory cell array is the same as equivalent circuit BLK1 shown in FIGS. 4 and 7. That is, the lower string includes a source selection transistor SST, a first dummy memory cell DMC1, and first and second main memory cells MMC1 and MMC2. The upper string includes third and fourth main memory cells MMC3 and MMC4, a second dummy memory cell DMC2, and a drain selection transistor DST.

A 3-dimensional memory cell array according to some embodiments of has been explained thus far. However, it will be understood that a structure of the 3-dimensional memory cell array is changed in various ways. Accordingly, the structure of the memory cell array is changed in various ways to provide the equivalent circuit shown in FIGS. 4 and 7.

FIG. 8 is a flowchart of operations of a semiconductor memory device 100 according to some embodiments.

As described above, it is assumed in some embodiments that normal word line is synonymous with main word line.

Referring to FIGS. 7 and 8, initially, in step S810, a reference voltage is applied to an unselected drain select line (e.g., one of drain select lines DSL1 and DSL2), and a power supply voltage is applied to a selected drain select line (e.g., the other drain select lines DSL1 and DSL2). Unlike a semiconductor memory device having a 2-dimensional array structure, in a semiconductor memory device having a 3-dimensional array structure according to some embodiments, since cell strings CS11 and CS12 are connected to one bit line BL1, a process of selecting a cell string on which an operation is performed as in step S810.

For example, during a program operation, when one drain select line (e.g., DSL1) of the drain select lines DSL1 and DSL2 is selected and a power supply voltage is applied, a selected cell string (e.g., CS11) is electrically connected to the bit line BL1. A reference voltage (e.g., a ground voltage or a negative voltage) is applied to the remaining unselected drain select line (e.g., DSL2) so that unselected cell strings (e.g., CS21) can be electrically isolated from the bit line BL1. That is, the unselected cell strings (e.g., CS21) is floating.

Accordingly, when a high voltage is subsequently applied to a main word line, memory cells connected to the main word line out of the selected cell string are programmed, while unselected cell strings are boosted due to high voltages applied to the word lines DWL1, DWL2, and MWL1 to MWL4, so memory cells of the unselected cell strings are not programmed.

Next, after a positive voltage is applied to a dummy word line to bounce the unselected drain select line in step S820, a word line voltage is applied to the normal word line in step S830.

Although dummy memory cells DMC1 and DMC2 are the same nonvolatile memory cells as main memory cells MMC1 to MMC4, the dummy memory cells DMC1 and DMC2 are not cells configured to store data but rather cells configured for other operational purposes, for example, a reduction in program speed of cells adjacent to the respective selection transistors SST and DST, out of the main memory cells MMC1 to MMC4.

As described above, unselected cell strings (e.g., CS21) are floating so that memory cells of the unselected cell strings are not programmed during a program operation. However, when a dummy word line bias voltage is applied to dummy word lines DWL1 and DWL2 disposed adjacent to the selection transistors SST and DST, the selection lines SSL and DSL are bounced. In this case, the selection transistors SST and DST are unintentionally turned on so that the unselected cell strings can be electrically connected to the bit line BL1 and the common source line CSL. This hinders the stable floating of the unselected cell strings. As a result, a boosting level of the unselected cell strings is reduced, so disturbance occurs.

To address the above-described problems, in some embodiments of, after step S 820 is performed, step S830 is performed. Specifically, in step S 820, a positive voltage (Dummy WL Bias) is applied to dummy word lines DWL1 and DWL2 to bounce an unselected drain select line (e.g., DSL2). Thereafter, in step S830, a word line voltage Vpass or Vpgm is applied to normal word lines MWL1 to MWL4. That is, before a word line voltage is applied to the normal word lines MWL1 to MWL4, a positive voltage (Dummy WL Bias) is applied to the dummy word lines DWL1 and DWL2 so that the unselected drain select line (e.g., DSL2) can be bounced in advance to reduce disturbance.

Figure 9:
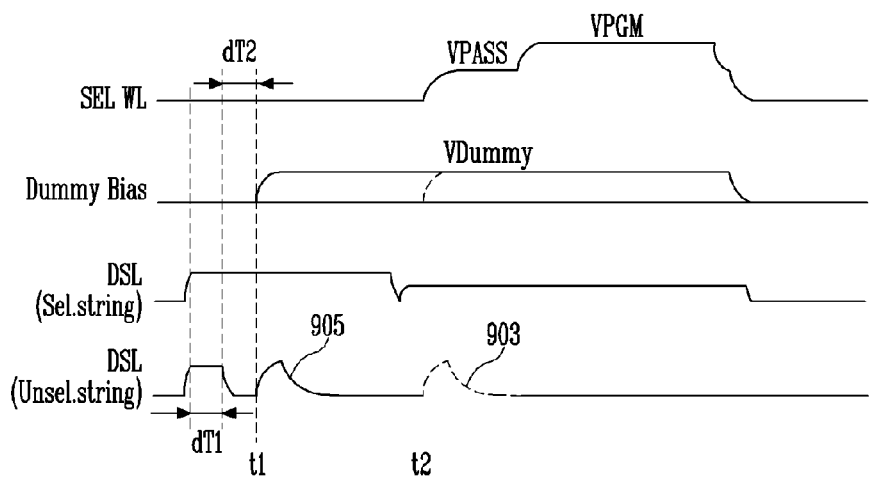
FIG. 9 is a timing diagram of voltages applied during operations of a semiconductor memory device according to some embodiments.

FIG. 9 is a timing diagram of voltages applied during operations of a semiconductor memory device according to some embodiments.

As described above, it is assumed in some embodiments that a normal word line is synonymous with a main word line.

Referring to FIG. 9, a reference voltage (e.g., 0 V) is applied to an unselected drain select line DSL2 Unsel.string, and a power supply voltage (e.g., 2 V) is applied to a selected drain select line DSL1 Sel.string during the drain selection period period dT2. In this case, as shown in FIG. 9, a precharge voltage (e.g., 3.5 V) is applied to the unselected drain select line DSL Unsel. string and the selected drain select line DSL Sel.string during the precharge period dT1. The application of the precharge voltage is ended before the word line voltage is applied to the normal word line.

During the application of the reference voltage or the precharge voltage to the unselected drain select line DSL2, a positive voltage VDummy is applied to dummy word lines DWL1 and DWL2 (e.g., at a time point t1) when a word line voltage is not applied to the normal word line yet. In this case, a power supply voltage or a precharge voltage is applied to the selected drain select line DSL1. In this case, the unselected drain select line DSL2 is bounced, as indicated at 905, under the influence of the positive voltage VDummy applied to the dummy word lines DWL1 and DWL2.

Afterwards, when a program operation starts at a time point t2, a pass voltage Vpass or a program voltage Vpgm is applied to normal word lines (SEL WL) MWL1 to MWL4 to perform a program operation. The positive voltage VDummy applied to the dummy word lines DWL1 and DWL2 is maintained until the application of the word line voltage Vpass or Vpgm is ended (Dummy Bias).

When the positive voltage VDummy is applied to the dummy word lines DWL1 and DWL2 on or after the time point t2 at which the program operation starts, bouncing occurs, as indicated at 903, during the application of the pass voltage Vpass or the program voltage Vpgm to the normal word lines MWL1 to MWL4, so that disturbance occurs. In comparison, according to some embodiments, a positive voltage is applied (e.g., at the time point t1) to the dummy word lines DWL1 and DWL2 before the word line voltage Vpass or Vpgm is applied to the normal word lines MWL1 to MWL4 so that the unselected drain select line DSL2 can be bounced in advance, as indicated at 905. As a result, disturbance is reduced.

Figure 10:
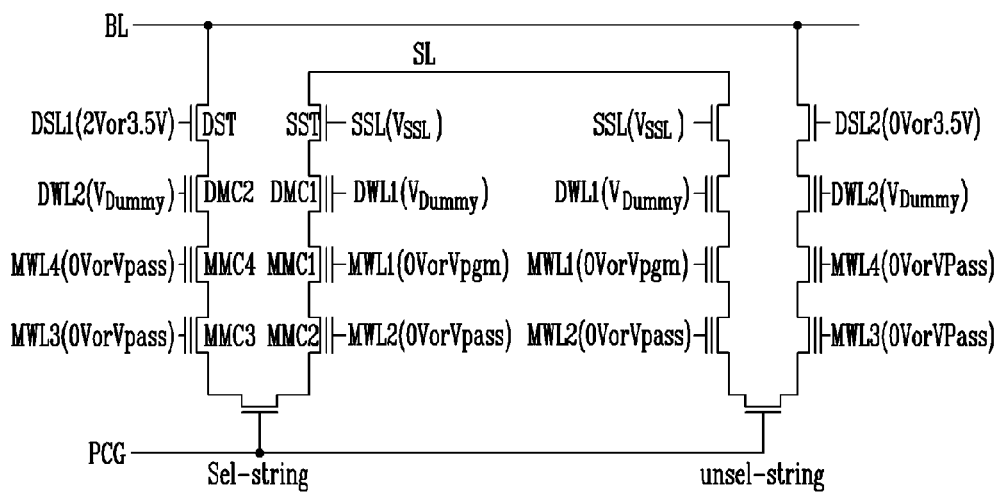
FIG. 10 is a circuit diagram of voltages applied during operations of a semiconductor memory device according to some embodiments.

FIG. 10 is a circuit diagram of voltages applied during operations of a semiconductor memory device according to some embodiments.

Referring to FIG. 10, a power supply voltage of about 2V and/or a precharge voltage of about 3.5V is applied to a drain select line DSL1 which becomes a selected drain select line. In comparison, a reference voltage of about 0V is applied to a drain select line DSL2 which becomes an unselected drain select line. In at least one embodiment, a precharge voltage of about 3.5V is applied to the unselected drain select line DSL2.

A positive voltage VDummy is applied to dummy word lines DWL1 and DWL2. In this case, a voltage of about 0V is applied to normal word lines MWL1 to MWL4 because a program operation is not programmed yet. That is, before a word line voltage Vpass or Vpgm is applied to the normal word lines MWL1 to MWL4, a positive voltage is applied to the dummy word lines DWL1 and DWL2.

As described above, when a voltage of about 0V applied to the normal word lines MWL1 to MWL4 before the program operation is performed, a positive voltage VDummy is applied to the dummy word lines DWL1 and DWL2 and bounces the unselected drain select line DSL2 in advance, thereby reducing disturbance.

Figure 11:
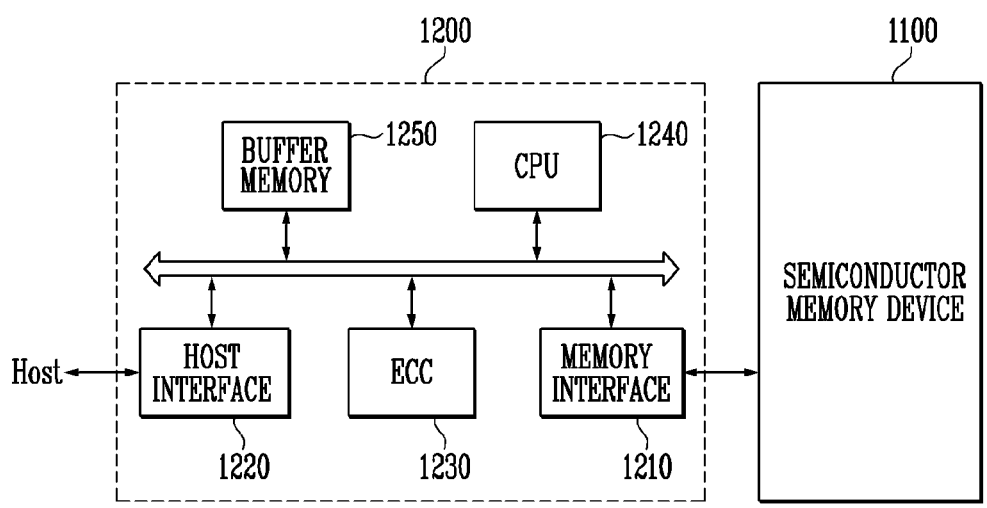
FIG. 11 is a block diagram of a memory system including a semiconductor memory device according to some embodiments.

FIG. 11 is a block diagram of a memory system 1000 including a semiconductor memory device 1100 according to some embodiments.

Referring to FIG. 11, the memory system 1000 includes a semiconductor memory device 1100 and a controller 1200.

Configuration and operations of the semiconductor memory device 1100 are the same as those of the semiconductor memory device 10 described with reference to FIG. 1, and thus a description thereof will not be repeated.

The controller 1200 is connected to a host and the semiconductor memory device 1100. Upon a response from the host, the controller 1200 is configured to access the semiconductor memory device 1100. For example, the controller 1200 is configured to control read, write, erase, and perform background operations of the semiconductor memory device 1100. The controller 1200 is configured to provide an interface between the semiconductor memory device 1100 and the host. The controller 1200 is configured to drive firmware to control the semiconductor memory device 1100.

The controller 1200 includes a memory interface 1210, a host interface 1220, an error check and correct (ECC) circuit 1230, a central processing unit (CPU) 1240, and a buffer memory 1250.

The memory interface 1210 transmits data received from the buffer memory 1250 to the semiconductor memory device 1100. Also, the memory interface 1210 transmits data read from the semiconductor memory device 1100 to the buffer memory 1250. Here, the memory interface 1210 uses an interface mode of a NAND flash memory device. That is, the controller 1200 performs program, read, and erase operations according to the interface mode of the NAND flash memory device.

The host interface 1220 includes a protocol configured to exchange data between the host and the controller 1200. In some embodiments, the host interface 1220 is configured to communicate with the host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA (SATA) protocol, a parallel-ATA (PATA) protocol, a small computer small interface (SCSI) protocol, an enhanced small disk interface (ESDI) protocol, an integrated drive electronics (IDE) protocol, and a private protocol.

The ECC circuit 1230 generates parity bits using data transmitted to the semiconductor memory device 1100. The generated parity bits are stored in semiconductor memory chips of the semiconductor memory device 1100. The ECC circuit 1230 detects errors in data read from the semiconductor memory device 1100 using the parity bits. When the detected errors are within a correction range, the ECC circuit 1230 corrects the detected errors.

The CPU 1240 analyzes and processes signals input from the host. The CPU 1240 controls the host or the semiconductor memory device 1100 through the host interface 1220 or the memory interface 1210.

The CPU 1240 controls the semiconductor memory device 1100 according to firmware configured to control the semiconductor memory device 1100.

The buffer memory 1250 temporarily stores program data provided from the host or data read from the semiconductor memory device 1100. Also, the buffer memory 1250 stores meta data or cache data to be stored in the semiconductor memory device 1100. At a sudden power-off, the meta data or cache data stored in the buffer memory 1250 are stored in the semiconductor memory device 1100. The buffer memory 1250 includes a DRAM or an SRAM.

The semiconductor memory device 1100 and the controller 1200 are integrated in one semiconductor device. In some embodiments, the controller 1200 and the semiconductor memory device 1100 are integrated in a single semiconductor device and constitute a memory card. For example, the semiconductor memory device 1100 and the controller 1200 are integrated in one semiconductor device and constitute a memory card, such as a personal computer memory card international association (PCMCIA) card, a compact flash (CF) card, a smart media card (SMC), a memory stick, a multimedia card (MMC, a reduced-size MMC (RS-MMC), or MMCmicro), a secure digital card (SD, miniSD, microSD, or secure digital high capacity (SDHC)), or a universal flash storage (UFS).

The semiconductor memory device 1100 and the controller 1200 are integrated in a single semiconductor device and constitute a semiconductor drive (e.g., a solid-state drive (SSD)). The SSD includes a storage device configured to store data in a semiconductor memory. When the memory system 1000 is used as the SSD, an operation speed of the host connected to the memory system 1000 can be greatly improved.

In another example, the memory system 1000 is provided as one of various components of an electronic apparatus such as a computer, ultra mobile PC (UMPC), workstation, netbook, personal digital assistant (PDA), portable computer, web tablet, wireless phone, mobile phone, smart phone, e-book, portable multimedia player (PMP), portable game console, navigation device, black box, digital camera, 3-dimensional television, digital audio recorder, digital audio player, digital picture recorder, digital picture player, digital video recorder, digital video player, apparatus capable of transmitting and receiving information in a wireless environment, one of various electronic apparatuses constituting a home network, one of various electronic apparatuses constituting a computer network, one of various electronic apparatuses constituting a telematics network, a radio-frequency identification (RFID) device, and one of various components forming a computing system.

In some embodiments, the semiconductor memory device 1100 or the memory system 1000 is mounted in a package having various shapes. For example, the semiconductor memory device 1100 or the memory system 1000 is mounted in a package using various techniques, such as Package on Package (PoP), ball grid arrays (BGAs), chip scale packages (CSPs), plastic leaded chip carrier (PLCC), plastic dual in line package (PDIP), Die in Waffle Pack (DWP), Die in Wafer Form (DWF), Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 12:
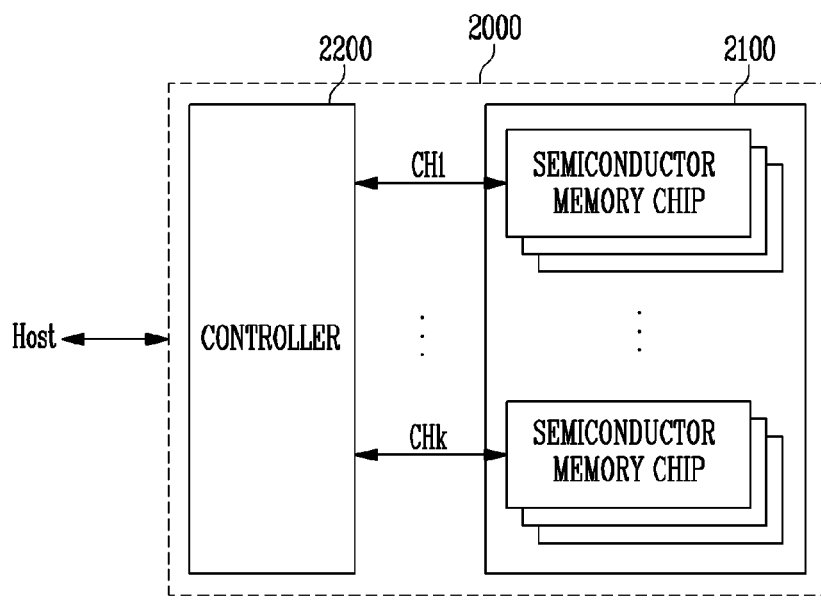
FIG. 12 is a block diagram of an applied example of the memory system shown in FIG. 11.

FIG. 12 is a block diagram of an applied example 2000 of the memory system 1000 shown in FIG. 11.

Referring to FIG. 12, the memory system 2000 includes a semiconductor memory device 2100 and a controller 2200. The semiconductor memory device 2100 includes semiconductor memory chips. Configuration and operations of each of the semiconductor memory chips are the same as those of the semiconductor memory device 100 described with reference to FIG. 1.

The semiconductor memory chips are divided into a plurality of groups. FIG. 12 illustrates an example in which the groups communicate with the controller 2200 through first through k-th channels CH1 to CHk, respectively.

Each of the groups is configured to communicate with the controller 2200 through one common channel. The controller 2200 has the same configuration as the controller 1200 described with reference to FIG. 11 and is configured to control the memory chips of the semiconductor memory device 2100 through the channels CH1 to CHk.

FIG. 12 illustrates an example in which semiconductor memory chips are connected to one channel. However, the memory system 2000 is modified such that one semiconductor memory chip is connected to one channel.

Figure 13:
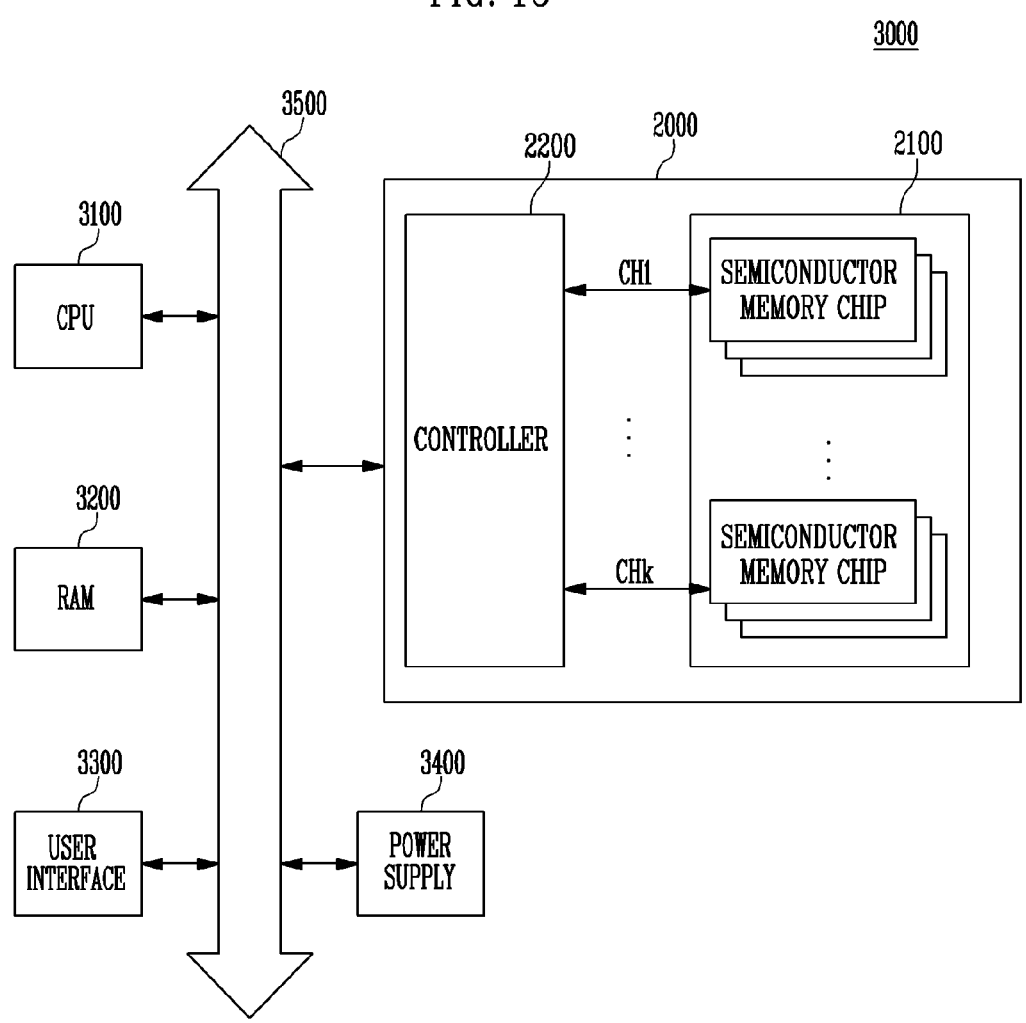
FIG. 13 is a block diagram of a computing system including the memory system described with reference to FIG. 12.

FIG. 13 is a block diagram of a computing system 3000 including the memory system 2000 described with reference to FIG. 12.

Referring to FIG. 13, the computing system 3000 includes a central processing unit (CPU) 3100, a random access memory (RAM) 3200, a user interface 3300, a power supply 3400, a system bus 3500, and a memory system 2000.

The memory system 2000 is electrically connected to the CPU 3100, the RAM 3200, the user interface 3300, and the power supply 3400 through the system bus 3500. Data provided through the user interface 3300 or data processed by the CPU 3100 is stored in the memory system 2000.

FIG. 13 illustrates an example in which the semiconductor memory device 2100 is connected to the system bus 3500 through the controller 2200. However, the semiconductor memory device 2100 is directly connected to the system bus 3500. In this case, functions of the controller 2200 are performed by the CPU 3100 and the RAM 3200.

FIG. 13 illustrates an example in which the memory system 2000 described with reference to FIG. 12 is provided. However, the memory system 2000 is replaced by the memory system 1000 described with reference to FIG. 12. In some embodiments, the computing system 3000 is configured to include all the memory systems 1000 and 2000 described with reference to FIGS. 11 and 12.

Typical exemplary embodiments are disclosed in the above description and the drawings. Although specific terms are employed, they are used in a generic and descriptive sense only and not for purposes of limitation. It will be understood by those of ordinary skill in the art that various changes in form and details are made to the disclosed embodiments without departing from the spirit and scope as defined by the following claims.

What is claimed is:

1. A method of operating a semiconductor memory device comprising memory cells stacked on a substrate, the method comprising:
    applying a reference voltage to an unselected drain select line;
    applying a drain selection voltage to a selected drain select line; and
    applying a word line voltage to a normal word line,
    wherein
        a precharge voltage is applied to the unselected drain select line before the reference voltage is applied to the unselected drain select line,
        a positive voltage is applied to a dummy word line when the precharge voltage is applied to the unselected drain select line,
        the positive voltage is applied to the dummy word line before the word line voltage is applied to the normal word line, and
        the positive voltage applied to the dummy word line is maintained until the application of the word line voltage is ended.

2. The method of claim 1, wherein the positive voltage applied to the dummy word line bounces the unselected drain select line.

3. The method of claim 1, wherein the positive voltage is applied to the dummy word line during the application of the reference voltage to the unselected drain select line.

4. The method of claim 1, wherein the application of the precharge voltage is ended before the word line voltage is applied to the normal word line.

5. The method of claim 1, wherein, during the application of the drain selection voltage to the selected drain select line, the positive voltage is applied to the dummy word line.

6. The method of claim 1, wherein the precharge voltage applied to the unselected drain select line is a first precharge voltage, and before the drain selection voltage is applied to the selected drain select line, the positive voltage is applied to the dummy word line during an application of a second precharge voltage to the selected drain select line.

7. The method of claim 6, wherein the application of the second precharge voltage is ended before the word line voltage is applied to the normal word line.

8. A semiconductor memory device, comprising:
    a memory cell array comprising memory cells stacked on a substrate, the memory cells connected with each other into cell strings; and
    a peripheral circuit configured to
        apply a reference voltage to an unselected drain select line of an unselected cell string of the cell strings,
        apply a word line voltage to a normal word line of the cell strings, and
        apply a positive voltage to a dummy word line of the cell strings before the word line voltage is applied to the normal word line,
        apply a precharge voltage to the unselected drain select line before the reference voltage is applied to the unselected drain select line,
        apply the positive voltage to the dummy word line when the precharge voltage is applied to the unselected drain select line, and
        maintain the positive voltage applied to the dummy word line until the application of the word line voltage is ended.

9. The device of claim 8, wherein the peripheral circuit is configured to apply the positive voltage to the dummy word line to bounce the unselected drain select line.

10. The device of claim 8, wherein the peripheral circuit is configured to apply the positive voltage to the dummy word line during the application of the reference voltage to the unselected drain select line.

11. The device of claim 8, wherein the peripheral circuit is further configured to end the application of the precharge voltage before the word line voltage is applied to the normal word line.

12. The device of claim 8, wherein the peripheral circuit is further configured to apply the positive voltage to the dummy word line during an application of a drain selection voltage to a selected drain select line of the selected cell string.

13. The device of claim 8, wherein the precharge voltage applied to the unselected drain select line is a first precharge voltage, and before the drain selection voltage is applied to a selected drain select line of the selected cell string, the peripheral circuit is further configured to apply the positive voltage to the dummy word line during an application of a second precharge voltage to the selected drain select line.

14. The device of claim 13, wherein the peripheral circuit is configured to end the application of the second precharge voltage before the word line voltage is applied to the normal word line.

15. A memory system, comprising:
   a semiconductor memory device; and
   a controller configured to control the semiconductor memory device,
   wherein the semiconductor memory device comprises:
   a memory cell array including memory cells stacked on a substrate, the memory cells connected with each other into cell strings; and
   a peripheral circuit configured to
      apply a reference voltage to an unselected drain select line of an unselected cell string of the cell strings,
      apply a word line voltage to a normal word line of the cell strings, and
      apply a positive voltage to a dummy word line of the cell strings before the word line voltage is applied to the normal word line,
      apply a precharge voltage to the unselected drain select line before the reference voltage is applied to the unselected drain select line,
      apply the positive voltage to the dummy word line when the precharge voltage is applied to the unselected drain select line, and
      maintain the positive voltage applied to the dummy word line until the application of the word line voltage is ended.

16. The system of claim 15, wherein the peripheral circuit is further configured to apply the positive voltage to the dummy word line to bounce the unselected drain select line.

* * * * *